United States Patent
Nakatsuka et al.

(10) Patent No.: US 7,667,558 B2
(45) Date of Patent: Feb. 23, 2010

(54) THIN FILM ELASTIC WAVE RESONATOR

(75) Inventors: Hiroshi Nakatsuka, Osaka (JP);
Tomohiro Iwasaki, Osaka (JP); Keiji Onishi, Osaka (JP)

(73) Assignee: Panasonic Corporation, Osaka (JP)

( * ) Notice: Subject to any disclaimer, the term of this patent is extended or adjusted under 35 U.S.C. 154(b) by 277 days.

(21) Appl. No.: 11/791,027

(22) PCT Filed: Dec. 6, 2005

(86) PCT No.: PCT/JP2005/022349

§ 371 (c)(1),
(2), (4) Date: May 18, 2007

(87) PCT Pub. No.: WO2006/062083

PCT Pub. Date: Jun. 15, 2006

(65) Prior Publication Data

US 2009/0121809 A1    May 14, 2009

(30) Foreign Application Priority Data

Dec. 7, 2004  (JP) .................. 2004-354516
Mar. 28, 2005 (JP) .................. 2005-092863

(51) Int. Cl.
H03H 9/13  (2006.01)
H03H 9/15  (2006.01)
H03H 9/54  (2006.01)

(52) U.S. Cl. ............... 333/187; 333/189; 310/366
(58) Field of Classification Search ......... 333/187–189; 310/365–366
See application file for complete search history.

(56) References Cited

U.S. PATENT DOCUMENTS

| 2,943,278 | A | * | 6/1960 | Mattiat | 333/32 |
| 2,969,512 | A | * | 1/1961 | Hans et al. | 333/187 |
| 4,529,904 | A | * | 7/1985 | Hattersley | 310/318 |
| 4,642,508 | A | * | 2/1987 | Suzuki et al. | 310/321 |
| 4,870,313 | A | * | 9/1989 | Hirama et al. | 310/320 |
| 6,188,163 | B1 | * | 2/2001 | Danov | 310/366 |
| 6,737,940 | B2 | | 5/2004 | Takeuchi et al. | |
| 6,862,441 | B2 | * | 3/2005 | Ella | 455/307 |
| 2005/0151600 | A1 | | 7/2005 | Takeuchi et al. | |

FOREIGN PATENT DOCUMENTS

JP   44-11605   5/1969

(Continued)

*Primary Examiner*—Barbara Summons
(74) *Attorney, Agent, or Firm*—Wenderoth, Lind & Ponack, L.L.P.

(57) ABSTRACT

An upper electrode (50) includes a first electrode (51) formed in a circle and a second electrode (52) formed in an annulus outside the first electrode (51). The first electrode (51) and the second electrode (52) are electrically separated from each other via an insulating region. A lower electrode (30) includes a third electrode (31) formed in a circle and a fourth electrode (32) formed in an annulus outside of the third electrode (31). Similarly, the third electrode (31) and the fourth electrode (32) are electrically separated from each other via an insulating region. Further, the third electrode (31) is provided so as to face the first electrode (51) via the piezoelectric body (40) and the fourth electrode (32) is provided to face the second electrode (52) via the piezoelectric body (40), respectively.

20 Claims, 20 Drawing Sheets

FOREIGN PATENT DOCUMENTS

| | | |
|---|---|---|
| JP | 52-31698 | 8/1977 |
| JP | 60-068711 | 4/1985 |
| JP | 02-113616 | 4/1990 |
| JP | 10-200369 | 7/1998 |
| JP | 2003-087086 | 3/2003 |
| JP | 2003-347889 | 12/2003 |

\* cited by examiner

F I G. 9
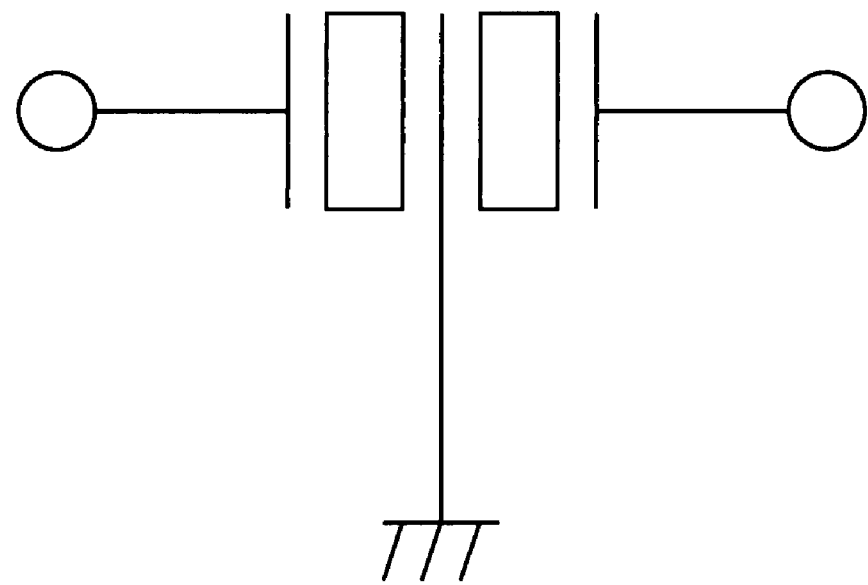

(a)

(b)

(c)

(d)

(a)

(b)

ND FILM ELASTIC WAVE RESONATOR

THIN FILM ELASTIC WAVE RESONATOR

FIELD OF INVENTION

The present invention relates to a thin film elastic wave resonator and more particularly, to a thin film elastic wave resonator which allows a band-pass filter to be structured by a single resonator, to a filter using the same, and to a communication device using the same.

DESCRIPTION OF THE RELATED ART

A component which is built in an electronic device such as a mobile device is required to be reduced in size and weight. For example, a filter used in a mobile device is required to allow precise adjustment of frequency characteristics as well as to be miniaturized. As one of filters which satisfy these requirements, a filter using a thin-film elastic wave resonator has been known (refer to patent document 1).

Hereinafter, with reference to FIG. 24, a conventional thin film elastic wave resonator will be described.

FIG. 24(a) is a diagram illustrating a cross-sectional view of a basic structure of the conventional thin-film elastic wave resonator 500. The thin film elastic wave resonator 500 has a structure in which a piezoelectric body 501 is sandwiched between an upper electrode section 502 and a lower electrode section 503. This thin film elastic wave resonator 500 is used by being placed on a semiconductor substrate 505 having a cavity 504 formed therein. The cavity 504 can be formed through partially etching a back face of the semiconductor substrate 505 by using a fine processing technology. In this thin film elastic wave resonator 500, an electric field is applied by the upper electrode section 502 and the lower electrode section 503 in a thickness direction and vibration in the thickness direction is generated. Next, operations of the thin film elastic wave resonator 500 will be described with reference to longitudinal vibration in a thickness direction of an infinite flat plate.

FIG. 24(b) is a schematic diagram illustrating an oblique perspective view for describing the operations of the conventional thin film elastic wave resonator 500. When in the thin film elastic wave resonator 500, the electric field is applied between the upper electrode section 502 and the lower electrode section 503, electric energy is converted to mechanical energy by the piezoelectric body 501. The induced mechanical vibration is vibration expanding in the thickness direction, and expands and contracts in the same direction as that of the electric field. In general, the thin film elastic wave resonator 500 utilizes resonant vibration of the piezoelectric body 501 in the thickness direction and operates with resonance of a frequency at which a thickness of the piezoelectric body 501 is equal to a half-wave length. The cavity 504 shown in FIG. 24(a) is utilized in order to secure the longitudinal vibration in the thickness direction of the piezoelectric body 501.

An equivalent circuit of the thin film elastic wave resonator 500, as shown in FIG. 24(d), has both series resonance and parallel resonance. This equivalent circuit comprises: a series resonance section having a capacitor C1, an inductor L1, and a resistor R1; and a capacitor C0 connected in parallel with the series resonance section. In this circuit configuration, admittance frequency characteristics of the equivalent circuit are, as shown in FIG. 24(c), that an admittance is maximum at a resonance frequency fr and minimum at an anti-resonance frequency fa. Here, a relationship between the resonance frequency fr and the anti-resonance frequency fa is as follows.

$fr = 1/\{2\pi\sqrt{(L1 \times C1)}\}$ $fa = fr\sqrt{(1+C1/C0)}$

When the thin film elastic wave resonator 500 having such admittance frequency characteristics is adopted as a filter, since the resonant vibration of the piezoelectric body 501 is utilized, a downsized and low-loss filter can be realized. When two thin film elastic wave resonators are connected in series and in parallel (FIG. 25(a)), a band-pass filter can be easily structured (FIG. 25(b)).

In reality, since the thin film elastic wave resonator is invariably fixed on the substrate, all of the longitudinal vibration, in the thickness direction, generated at a vibration section is not excited as main resonant vibration and a part of the vibration leaks to the substrate. This vibration leakage to the substrate (unnecessary vibration) means that a part of energy to be originally used in excitation of vibration inside of the piezoelectric body is treated as a loss. Therefore, the invention which reduces an energy loss is disclosed in patent document 2 or the like.

[Patent document 1] Japanese Laid-Open Patent Publication No. 60-68711

[Patent document 2] Japanese Patent No. 2644855

BRIEF SUMMARY OF THE INVENTION

In the above-mentioned invention disclosed in patent document 2, the propagation of the traverse-mode vibration generated in the vibration section is prevented by separating the upper electrode so as to be in a direction perpendicular to a direction of the propagation of an elastic wave, thereby suppressing vibration leakage from the vibration section to the substrate. Accordingly, it can be expected that a stand-alone thin film elastic wave resonator can attain favorable filter characteristics.

However, in a case where a band-pass filter, whose passband width is wide to some extent, is structured by using the thin film elastic wave resonator disclosed in patent document 2, as described above, two independent thin film elastic wave resonators are absolutely required (FIG. 25(a)). Therefore, there accrues a problem of high cost stemming from a large area which a semiconductor chip in a filter occupies.

Therefore, an object of the present invention is to provide a thin film elastic wave resonator which allows a reduction in an energy loss and realizes a band-pass filter having a wide passband in a stand-alone manner.

The present invention is directed to a thin film elastic wave resonator which vibrates at a predetermined frequency, a filter using the thin film elastic wave resonator, and a communication device using the thin film elastic wave resonator. To achieve the above object, the present invention comprises: a piezoelectric body; a first electrode section formed on one surface of the piezoelectric body; a second electrode section which is formed on said one surface of the piezoelectric body, being positioned so as to encompass the first electrode section and be insulated from the first electrode section; a third electrode section which is formed on another surface of the piezoelectric body, which faces said one surface of the piezoelectric body; a fourth electrode section which is formed on said another surface of the piezoelectric body, being positioned so as to encompass the third electrode section and be insulated from the third electrode section; and a supporting section, for supporting a structure formed by the piezoelectric body and the first to fourth electrode sections, which includes at least a substrate. And the thin film elastic wave resonator having this configuration is characterized in that an electrical signal is inputted to between the first electrode section and the third electrode section and an electrical signal is outputted from between the second electrode section and the fourth electrode section, or an electrical signal is inputted to between the second electrode section and the fourth electrode section and an electrical signal is outputted from between the first electrode section and the third electrode section.

The respective electrode sections are formed such that an area of the first electrode section is substantially equal to an area of the third electrode section and an area of the second electrode section is substantially equal to an area of the fourth electrode section. As favorable shapes of the electrode sections, the first and third electrode sections are circular and the second and fourth electrode sections are annular. As shapes other than these, the first and third electrode sections may be polygonal and the second and fourth electrode sections may be multi-sided frame shaped. In these cases, it is preferable that a center of the first electrode section and a center of the second electrode section coincide, and a center of the third electrode section and a center of the fourth electrode section coincide. It is preferable that a clearance between the first electrode section and the second electrode section is equal to or greater than a thickness of the piezoelectric body.

A typical supporting section is structured by a substrate having a cavity provided therein, a substrate and a supporting layer laminated for forming a cavity in the substrate, or a substrate and an acoustic mirror formed by alternately laminating a layer in which an impedance is acoustically high and a layer in which an impedance is acoustically low. And the third and fourth electrode sections are disposed on the cavity or the acoustic mirror. It is possible to form the third and fourth electrode sections in an integrated manner.

The above-described thin film elastic wave resonator of the present invention, having a structure of a stand-alone resonator, reduces an energy loss and realizes a band-pass filter having a wide passband.

BRIEF DESCRIPTION OF THE DRAWINGS

FIG. 9 is a diagram illustrating a circuit which is equivalent to the thin film elastic wave resonator having a structure shown in FIG. 8.

DETAILED DESCRIPTION OF THE INVENTION

First Embodiment

Figure 1:
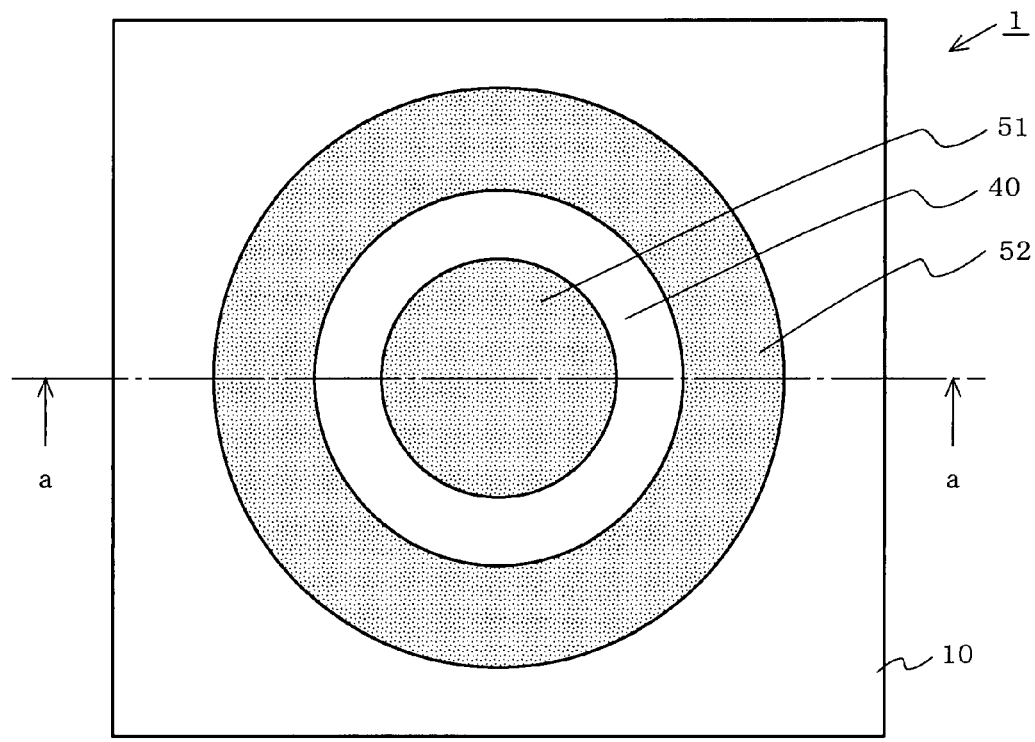
FIG. 1 is a structure diagram illustrating a top view of a thin film elastic wave resonator according to a first embodiment of the present invention.
Figure 2A:
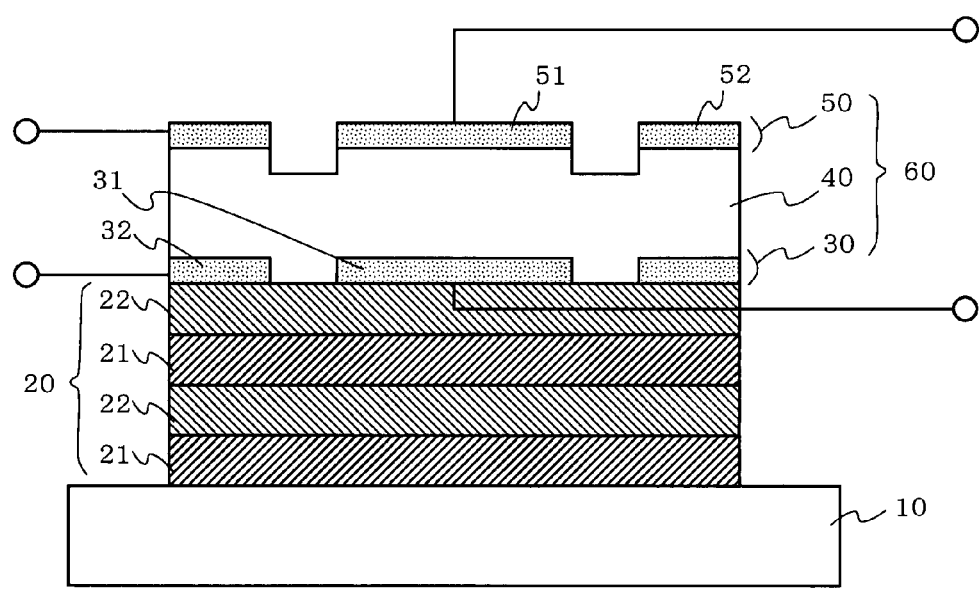
FIG. 2A is a structure diagram illustrating a cross-sectional view of the thin film elastic wave resonator according to the first embodiment of the present invention (a cross-sectional view along a line a-a shown in FIG. 1).
Figure 2B:
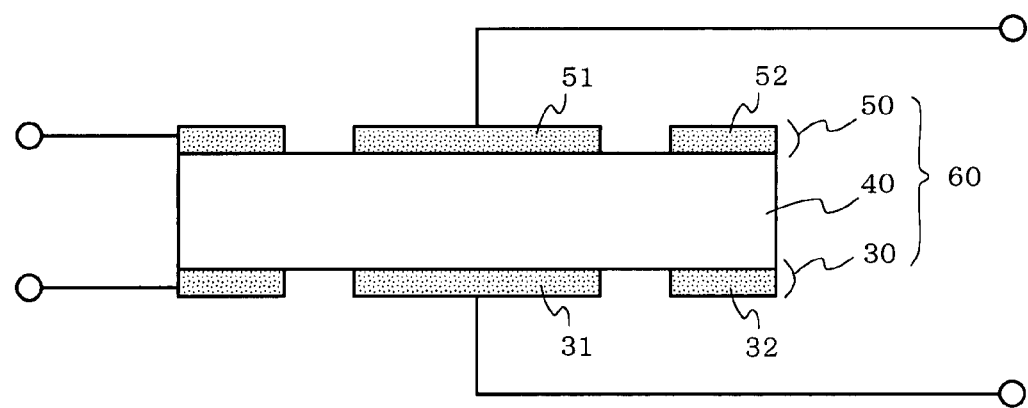
FIG. 2B is a basic structure diagram illustrating a cross-sectional view of the thin film elastic wave resonator of the present invention.
Figure 3:
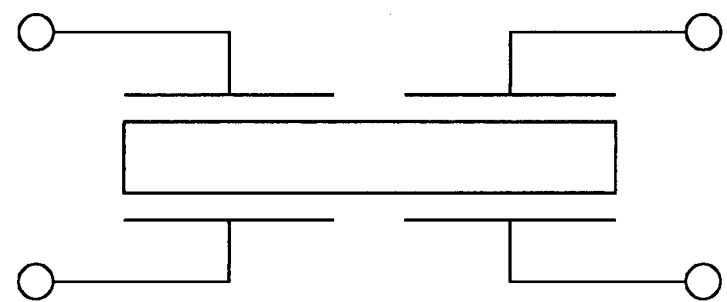
FIG. 3 is a diagram illustrating exemplary circuit symbols of the thin film elastic wave resonator according to the first embodiment of the present invention.

FIG. 1 is a diagram illustrating a top view of a constructional example of a thin film elastic wave resonator according to a first embodiment of the present invention. FIG. 2B is a diagram illustrating a cross-sectional view of a basic structure of the thin film elastic wave resonator shown in FIG. 1 along a line a-a. In the first embodiment, an example in which the thin film elastic wave resonator 1 has a cross-sectional view shown in FIG. 2A will be described. In FIGS. 1 and 2A, the thin film elastic wave resonator 1 according to the first embodiment has a structure in which an acoustic mirror 20, a lower electrode 30, a piezoelectric body 40, and an upper electrode 50 are formed in order on a semiconductor substrate 10. A vibration section 60 includes the lower electrode 30, the piezoelectric body 40, and the upper electrode 50. The semiconductor substrate 10 and the acoustic mirror 20 are a supporting section for the vibration section 60. The lower electrode 30 and the upper electrode 50 are made of, for example, molybdenum (Mo). The piezoelectric body 40 is made of, for example, a piezoelectric material such as aluminum nitride (AlN). FIG. 3 is a diagram illustrating one example of a case where the thin film elastic wave resonator according to the first embodiment is shown by circuit symbols.

First, a structure of the thin film elastic wave resonator 1 according to the first embodiment will be described in detail.

The acoustic mirror 20 is provided for containing resonant vibration inside of the vibration section 60. This acoustic mirror 20 is formed by alternately laminating at least two kinds of layers, a high acoustic impedance layer 21 and a low acoustic impedance layer 22 in this example, having acoustic impedances which are different from each other. Each of respective thicknesses of the high acoustic impedance layer 21 and the low acoustic impedance layer 22 is a quarter of each of respectively corresponding acoustic wave lengths. Under the lower electrode 30, the low acoustic impedance layer 22 is disposed.

The upper electrode 50 includes a first electrode section 51 which is formed in a circular shape and a second electrode section 52 which is formed in an annular shape outside of the first electrode section 51. The first electrode section 51 and the second electrode section 52 are electrically separated from each other via an insulating region. As shown in FIG. 1, it is preferable that the first electrode section 51 and the second electrode section 52 have shapes of a circle and an annulus which are concentric and as such, whose centers coincide with each other. In addition, it is favorable that a clearance between the first electrode section 51 and the second electrode section 52 is equal to or greater than a thickness of the piezoelectric body 40.

Similarly, the lower electrode 30 includes a third electrode section 31 which is formed in a circular shape and a fourth electrode section 32 which is formed in an annular shape outside of the third electrode section 31. The third electrode section 31 and the fourth electrode section 32 are electrically separated from each other via an insulating region. It is also favorable that the third electrode section 31 and the fourth electrode section 32 have shapes of a circle and an annulus which are concentric and as such, whose centers coincide with each other. In addition, it is favorable that a clearance between the third electrode section 31 and the fourth electrode section 32 is equal to or greater than a thickness of the piezoelectric body 40. In consideration of characteristics, it is most favorable that the third electrode section 31 is provided so as to face the first electrode section 51 via the piezoelectric body 40 and the fourth electrode section 32 is provided so as to face the second electrode section 52 via the piezoelectric body 40, respectively.

Figure 4:
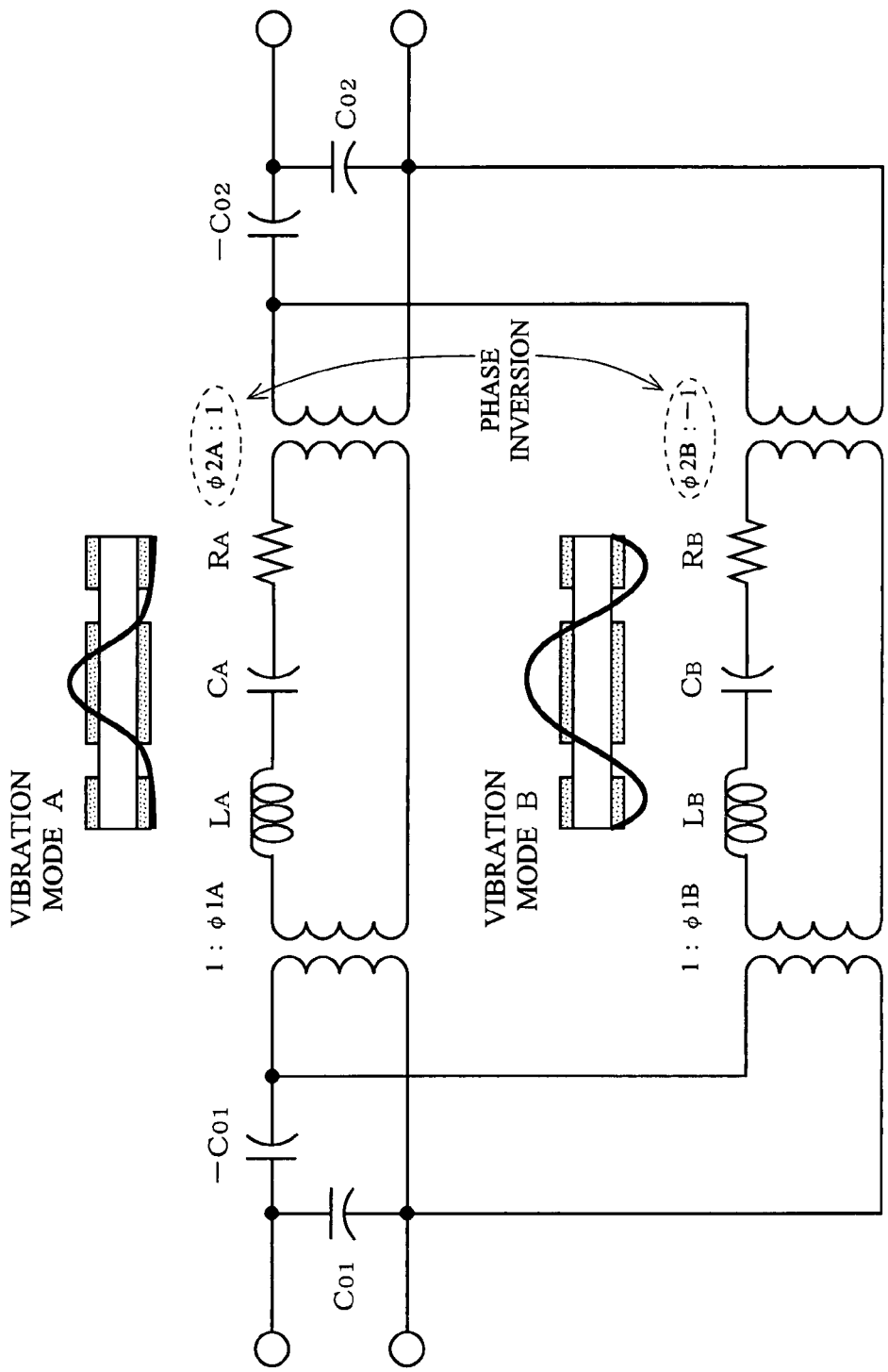
FIG. 4 is a diagram of an equivalent circuit of the thin film elastic wave resonator according to the first embodiment of the present invention.
Figure 5:
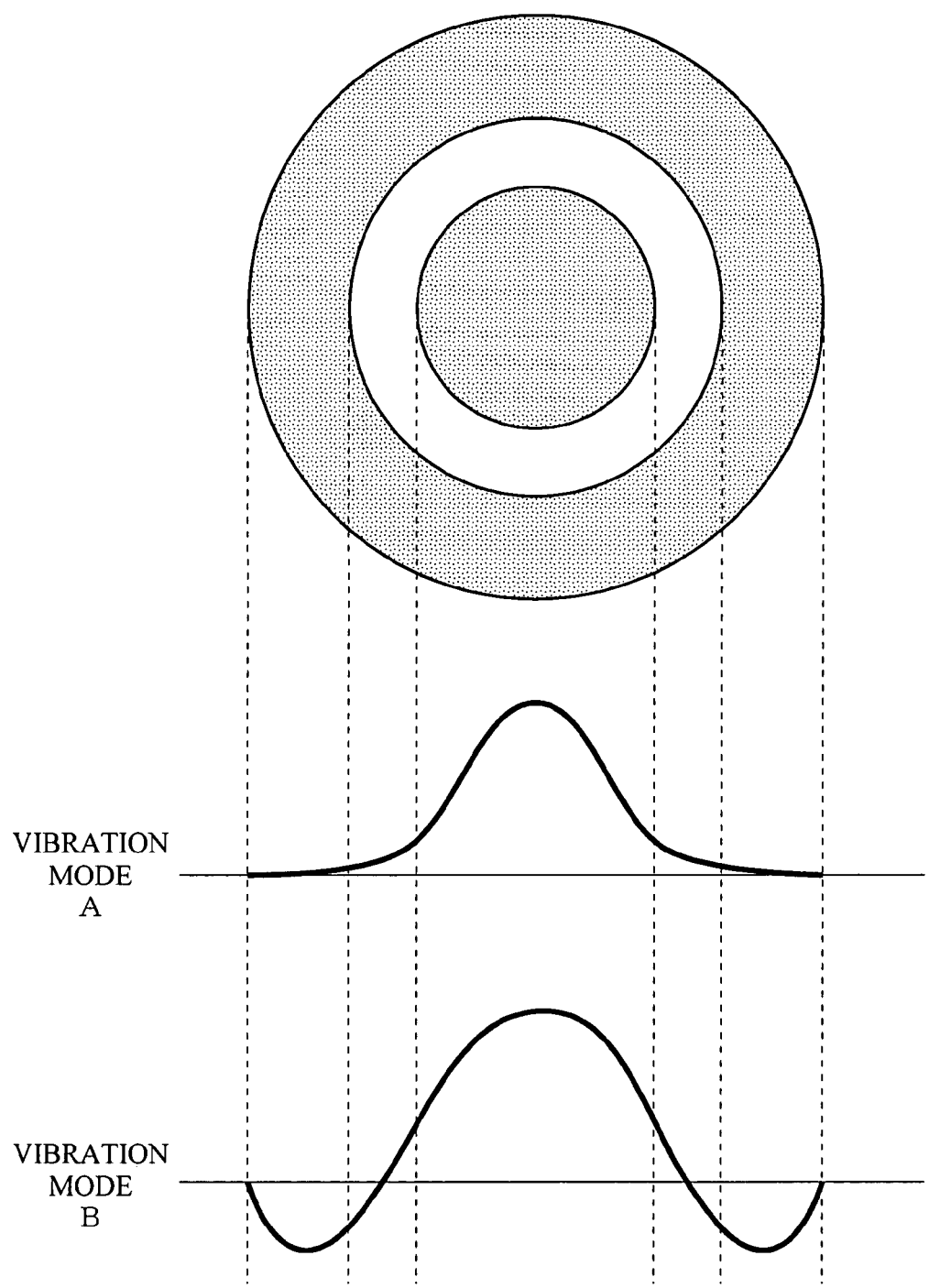
FIG. 5 is a diagram explaining two vibration modes generated by the thin film elastic wave resonator according to the first embodiment of the present invention.
Figure 6:
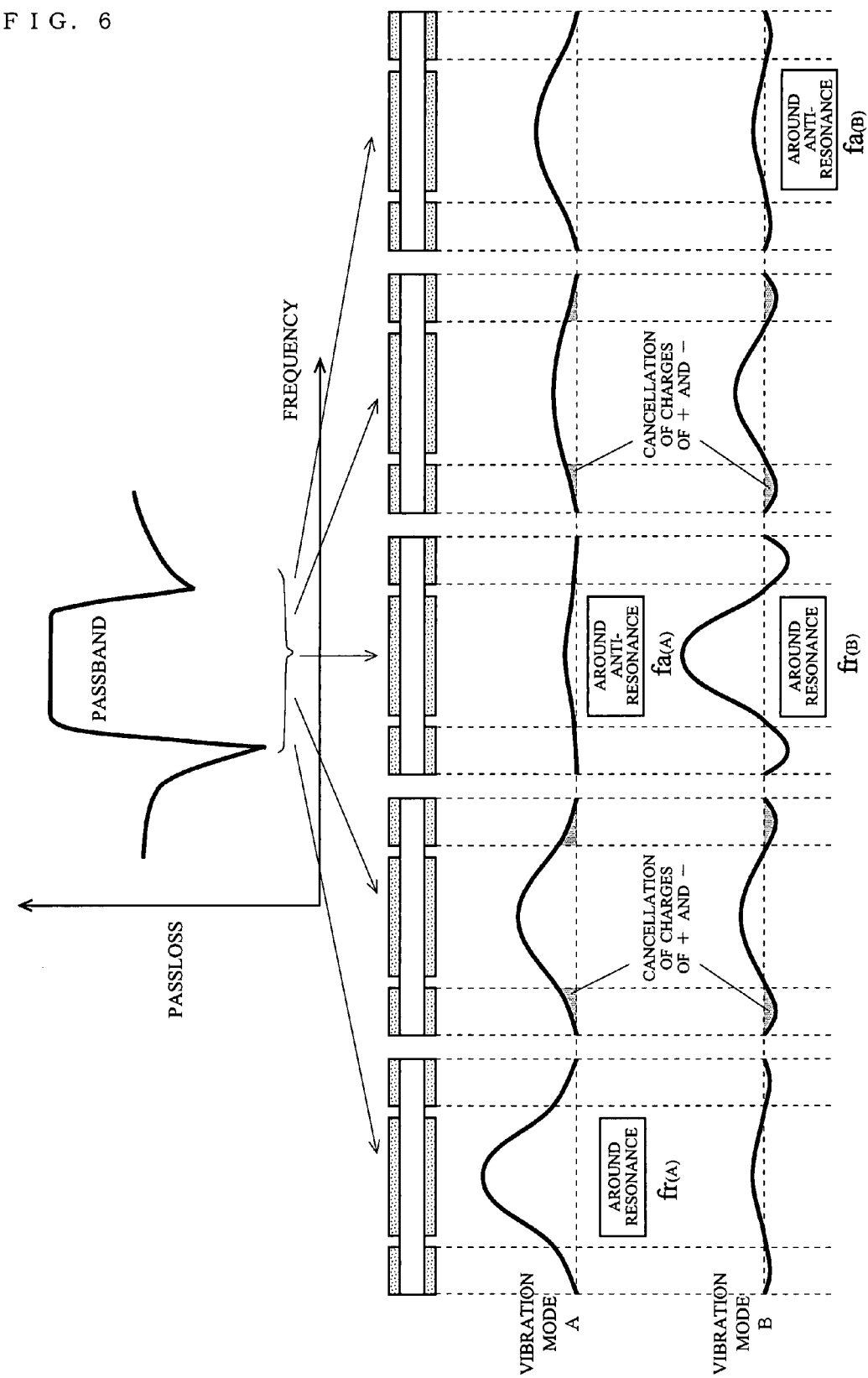
FIG. 6 is a diagram explaining a principle that a band-pass filter is structured by the thin film elastic wave resonator according to the first embodiment of the present invention.

Next, a principle that a band-pass filter can be realized by the thin film elastic wave resonator 1 according to the first embodiment will be described. FIG. 4 is a diagram showing an equivalent circuit of the thin film elastic wave resonator 1 according to the first embodiment. FIG. 5 is a diagram explaining two vibration modes generated in the thin film elastic wave resonator 1 according to the first embodiment. FIG. 6 is a diagram explaining the principle that by using the two vibration modes shown in FIG. 5, the band-pass filter can be structured by the thin film elastic wave resonator 1 according to the first embodiment.

An electrical signal for vibrating the thin film elastic wave resonator 1 is applied between the first electrode section 51 or the third electrode section 31. The applied electrical signal excites mechanical vibration due to an inverse piezoelectric effect. This excited vibration propagates through the piezoelectric body 40 and is transmitted to a region sandwiched by the second electrode section 52 and the fourth electrode section 32. Due to a piezoelectric effect, the propagated vibration is taken out from between the second electrode section 52 and the fourth electrode section 32 after having been converted into an electrical signal.

At this point, as described below, there exists two vibration modes, whose vibration patterns are different from each other, in the mechanical vibration excited by the first electrode section 51 and the third electrode section 31.

An electrical signal may be applied between the second electrode section 52 and the fourth electrode section 32. In this case, the electrical signal is taken out from the first electrode section 51 and the third electrode section 31 in a manner opposite to the above-mentioned manner.

When a structure of the thin film elastic wave resonator 1 is represented by an equivalent circuit, as shown in FIG. 4, there exists two resonance circuits. These two resonance circuits vibrate in patterns, in accordance with positions of the electrodes, which are different from each other as described below. In a first pattern, a peak of positive vibration is at the center of the first electrode section 51 and the third electrode section 31 and positive vibration is generated at the second electrode section 52 and the fourth electrode section 32 (vibration mode A in FIG. 5). In a second pattern, a peak of positive vibration is at the center of the first electrode section 51 and the third electrode section 31 and peaks of negative vibration are at the centers of widths of the second electrode section 52 and the fourth electrode section 32 (vibration mode B in FIG. 5). In other words, in the patterns, vibration is generated all between the first electrode section 51 and the third electrode section 31 as well as between the second electrode section 52 and the fourth electrode section 32.

In the vibration mode A, a charge generated by the vibration is maximum at a resonance frequency fr(A) and minimum at an anti-resonance frequency fa(A). On the other hand, in the vibration mode (B), a charge generated by the vibration is maximum at a resonance frequency fr(B) which is different from the resonance frequency fr(A) and minimum at an anti-resonance frequency fa(B) which is different from the anti-resonance frequency fa(A). Therefore, in a frequency region where the anti-resonance frequency fa(A) in the vibration mode A and the resonance frequency fr(B) in the vibration mode B approximate to each other, a pass loss in the thin film elastic wave resonator 1 is reduced and cancellation of a positive charge and a negative charge in both sides of the frequency region is observed, realizing characteristics of a filter having a wide passband as shown in FIG. 6.

In addition, when the respective electrodes and the piezoelectric body are set in an appropriate manner so that the anti-resonance frequency fa(A) in the vibration mode A and the resonance frequency fr(B) in the vibration mode B substantially coincide with each other, further reducing a loss in a passband is enabled, leading to a reduction in a loss in the thin film elastic wave resonator 1.

As described above, the thin film elastic wave resonator 1 according to the first embodiment of the present invention, having a structure of a stand-alone resonator, reduces an energy loss and realizes a band-pass filter having a wide passband.

Figure 7:
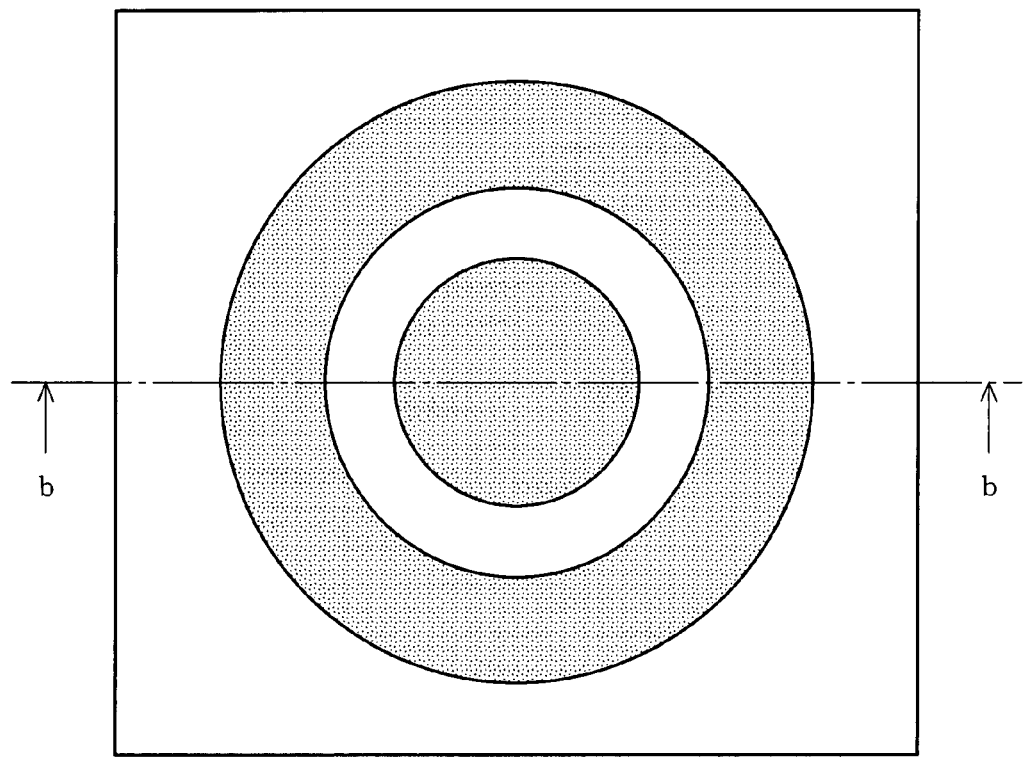
FIG. 7 is a structure diagram illustrating a top view of another thin film elastic wave resonator according to the first embodiment of the present invention.
Figure 8:
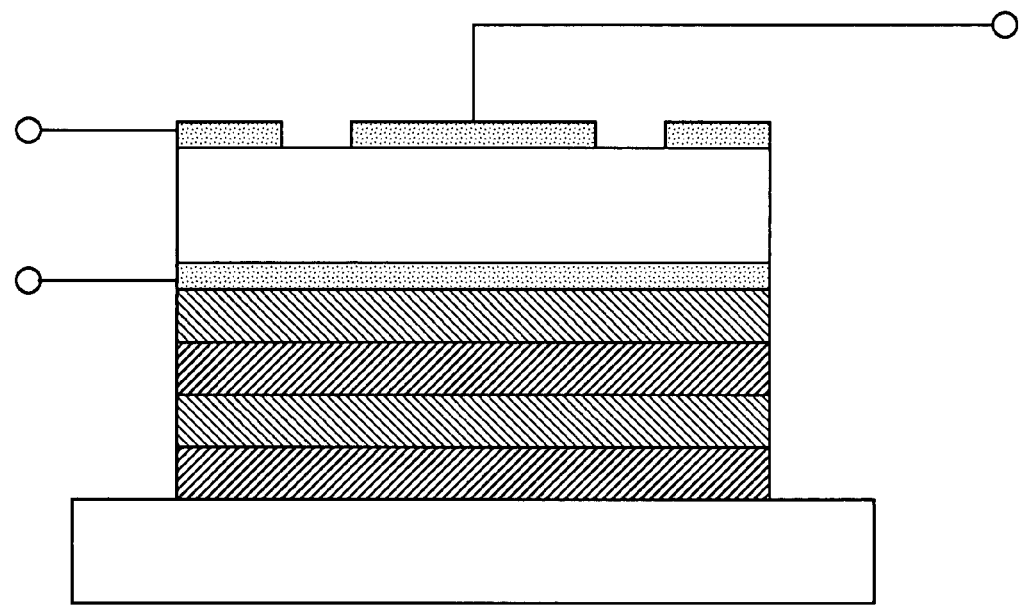
FIG. 8 is a structure diagram illustrating a cross-sectional view of said another thin film elastic wave resonator according to the first embodiment of the present invention (a cross-sectional view along a line b-b shown in FIG. 7).

In the first embodiment, although the example in which in the thin film elastic wave resonator 1, two sections such as the third electrode section 31 and the fourth electrode section 32 are formed in the lower electrode 30 is described, as shown in FIGS. 7 and 8, one electrode section may be formed in the lower electrode 30. The thin film elastic wave resonator having such a structure is equivalent to a stack-type filter (FIG. 9) and can exhibit similar effect to that described above.

Second Embodiment

Figure 10:
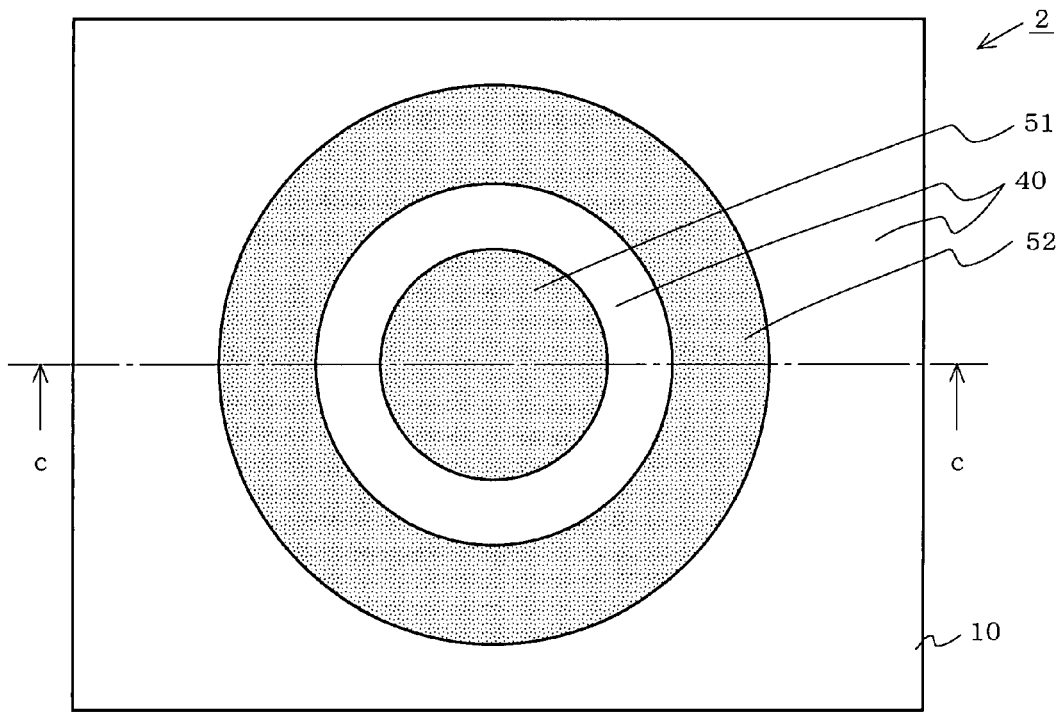
FIG. 10 is a structure diagram illustrating a top view of a thin film elastic wave resonator according to a second embodiment of the present invention.
Figure 11A:
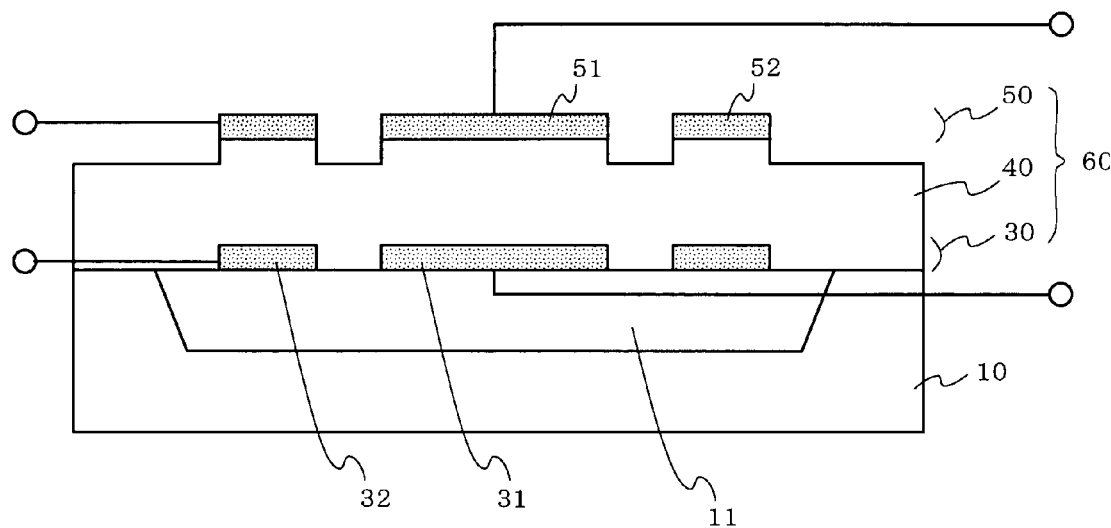
FIG. 11A is a structure diagram illustrating a cross-sectional view of the thin film elastic wave resonator according to the second embodiment of the present invention (a cross-sectional view along a line c-c shown in FIG. 10).

FIG. 10 is a diagram illustrating a top view of a constructional example of a thin film elastic wave resonator 2 according to a second embodiment of the present invention. FIG. 11A is a diagram illustrating a cross-sectional view of the thin film elastic wave resonator 2 shown in FIG. 10 along a line c-c. In FIGS. 10 and 11A, the thin film elastic wave resonator 2 according to the second embodiment has a structure in which a lower electrode 30, a piezoelectric body 40, and an upper electrode 50 are formed in order on a semiconductor substrate 10 having a cavity 11 formed therein. A vibration section 60 includes the lower electrode 30, the piezoelectric body 40, and the upper electrode 50. The semiconductor substrate 10 is a supporting section for the vibration section 60.

As shown in FIG. 1A, the thin film elastic wave resonator 2 according to the second embodiment has a structure in which the cavity 11, instead of the acoustic mirror 20 in the thin film elastic wave resonator 1 according to the above-described first embodiment, is provided in the semiconductor substrate 10. This cavity 11 is provided for containing resonant vibration of the vibration section 60 inside of the vibration section 60 similarly to the acoustic mirror 20.

Figure 11B:
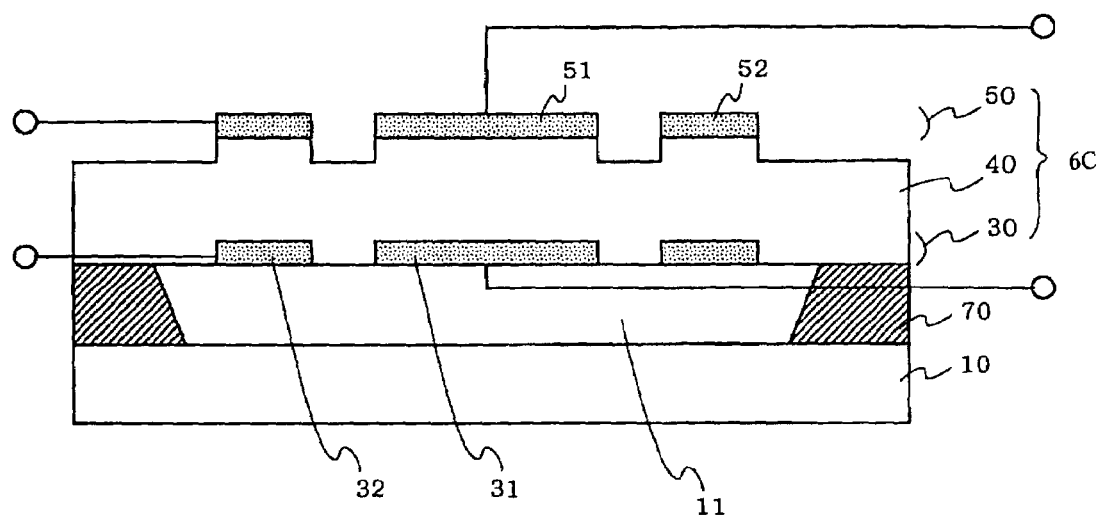
FIG. 11B is another structure diagram illustrating a cross-sectional view of the thin film elastic wave resonator according to the second embodiment of the present invention.

Therefore, similarly to the thin film elastic wave resonator 1 according to the first embodiment, the thin film elastic wave resonator 2 according to the second embodiment of the present invention, having a structure of a stand-alone resonator, reduces an energy loss and realizes a band-pass filter having a wide passband. Although in FIG. 11A, the cavity 11 formed through conducting etching or the like and caving in a part of the semiconductor substrate 10 is shown, as shown in FIG. 11B, the cavity 11 may be formed by laminating a supporting layer 70 on the semiconductor substrate 10.

Figure 12:
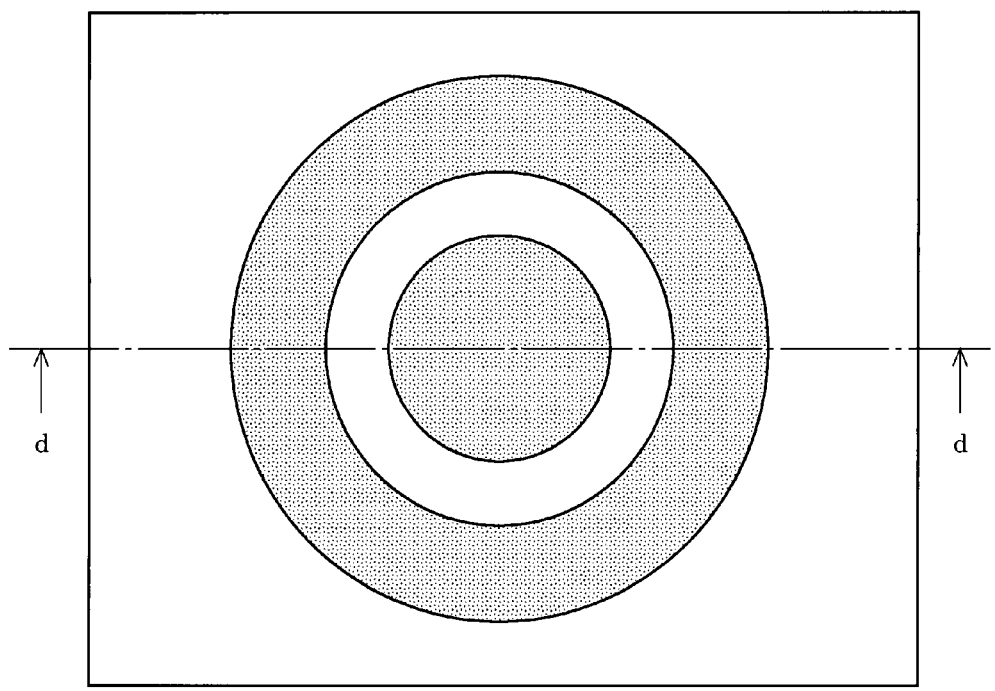
FIG. 12 is a structure diagram illustrating a top view of another thin film elastic wave resonator according to the second embodiment of the present invention.
Figure 13A:
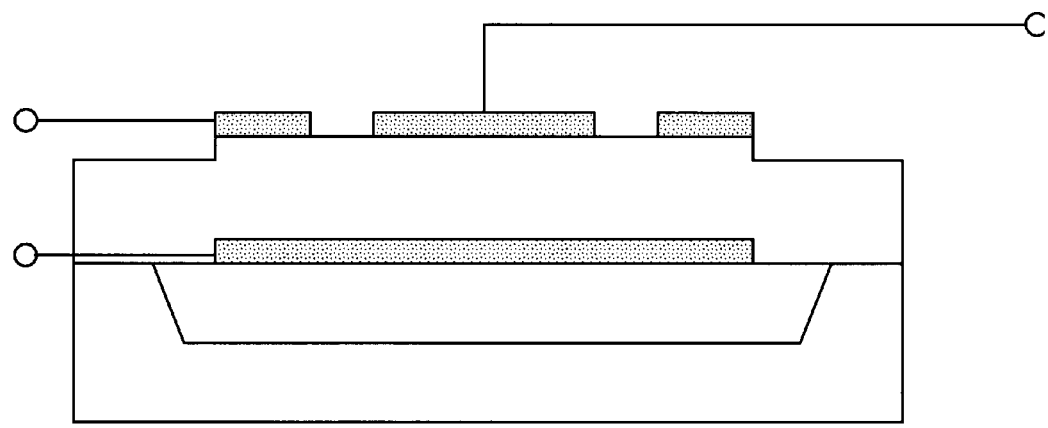
FIG. 13A is a structure diagram illustrating a cross-sectional view of said another thin film elastic wave resonator according to the second embodiment of the present invention (a cross-sectional view along a line d-d shown in FIG. 12).
Figure 13B:
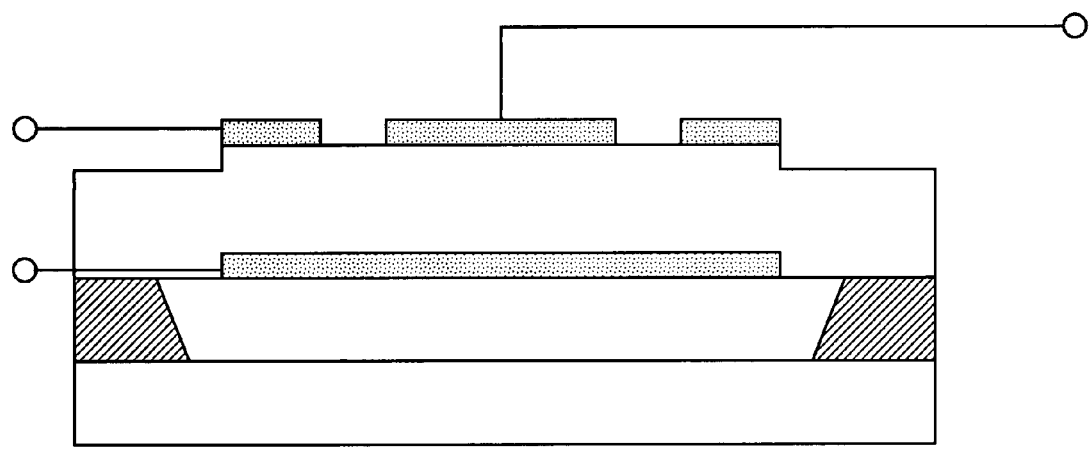
FIG. 13B is another structure diagram illustrating a cross-sectional view of another thin film elastic wave resonator according to the second embodiment of the present invention.

In the second embodiment, although the example in which in the thin film elastic wave resonator 2, two sections such as the third electrode section 31 and the fourth electrode section 32 are formed in the lower electrode 30 is described, as shown in FIGS. 12 and 13A, one electrode section may be formed in the lower electrode 30. The thin film elastic wave resonator having such a structure can exhibit similar effect to that described above. Also in this structure, the cavity may be formed by laminating a supporting layer on the semiconductor substrate as shown in FIG. 13B.

Third Embodiment

Figure 14:
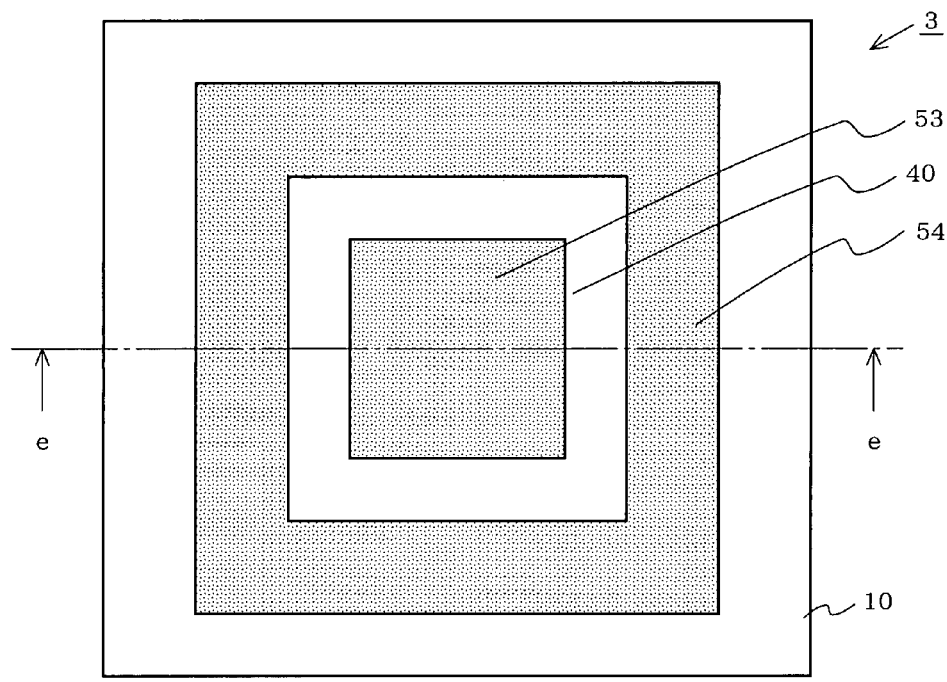
FIG. 14 is a structure diagram illustrating a top view of a thin film elastic wave resonator according to a third embodiment of the present invention.
Figure 15:
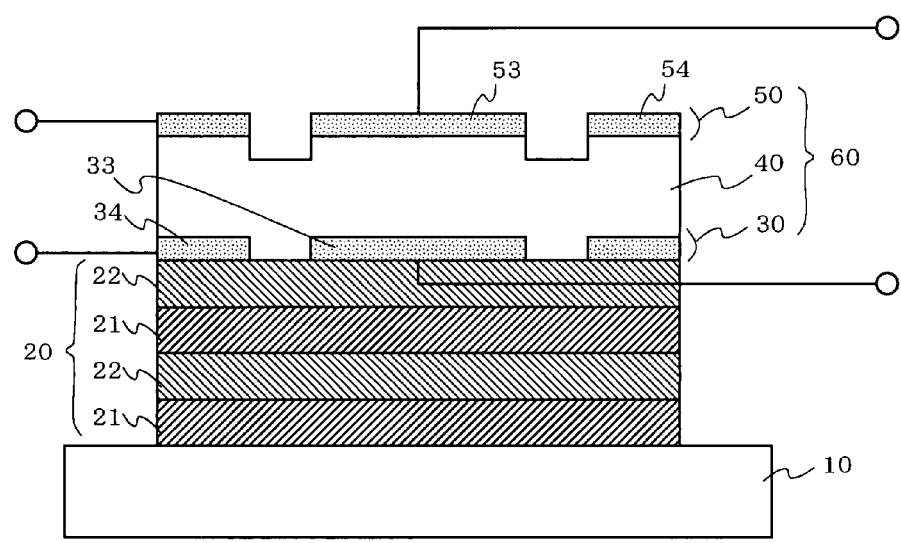
FIG. 15 is a structure diagram illustrating a cross-sectional view of the thin film elastic wave resonator according to the third embodiment of the present invention (a cross-sectional view along a line e-e shown in FIG. 14).

FIG. 14 is a diagram illustrating a top view of a constructional example of a thin film elastic wave resonator 3 according to a third embodiment of the present invention. FIG. 15 is a diagram illustrating a cross-sectional view of the thin film elastic wave resonator 3 shown in FIG. 14 along a line e-e. In FIGS. 14 and 15, the thin film elastic wave resonator 3 according to the third embodiment has a structure in which an acoustic mirror 20, a lower electrode 30, a piezoelectric body 40, and an upper electrode 50 are formed in order on a semiconductor substrate 10. Although this structure is same as that of the thin film elastic wave resonator 1 according to the above-described first embodiment, shapes of electrodes formed in the lower electrode 30 and the upper electrode 50 are different from those in the first embodiment as follows.

The upper electrode 50 includes a first electrode section 53 formed in a polygonal shape and a second electrode section 54 formed in a multi-sided frame shape outside of the first electrode section 53. The first electrode section 53 and the second electrode section 54 are electrically separated from each other via an insulating region. A shape of outer sides of the second electrode section 54 and a shape of inner sides of the second electrode section 54 are like figures of a shape of outer sides of the first electrode section 53. It is preferable that the first electrode section 53 and the second electrode section 54, which have a same center, are of a polygonal shape and a multi-sided frame shape. FIG. 14 is a diagram showing an example in which the polygonal shape of the first electrode section 53 is of a square.

Similarly, the lower electrode 30 includes a third electrode section 33 formed in a polygonal shape and a fourth electrode section 34 formed in a multi-sided frame shape outside of the third electrode section 33. The third electrode section 33 and the fourth electrode section 34 are electrically separated from each other via an insulating region. A shape of outer sides of the fourth electrode section 34 and a shape of inner sides of the fourth electrode section 34 are like figures of a shape of outer sides of the third electrode section 33. It is preferable that the third electrode section 33 and the fourth electrode section 34, which have a same center, are of a polygonal shape and a multi-sided frame shape. Further, in consideration of characteristics, it is most favorable that the third electrode section 33 is provided so as to face the first electrode section 53 via the piezoelectric body 40 and the fourth electrode section 34 is provided so as to face the second electrode section 54 via the piezoelectric body 40, respectively.

Figure 16:
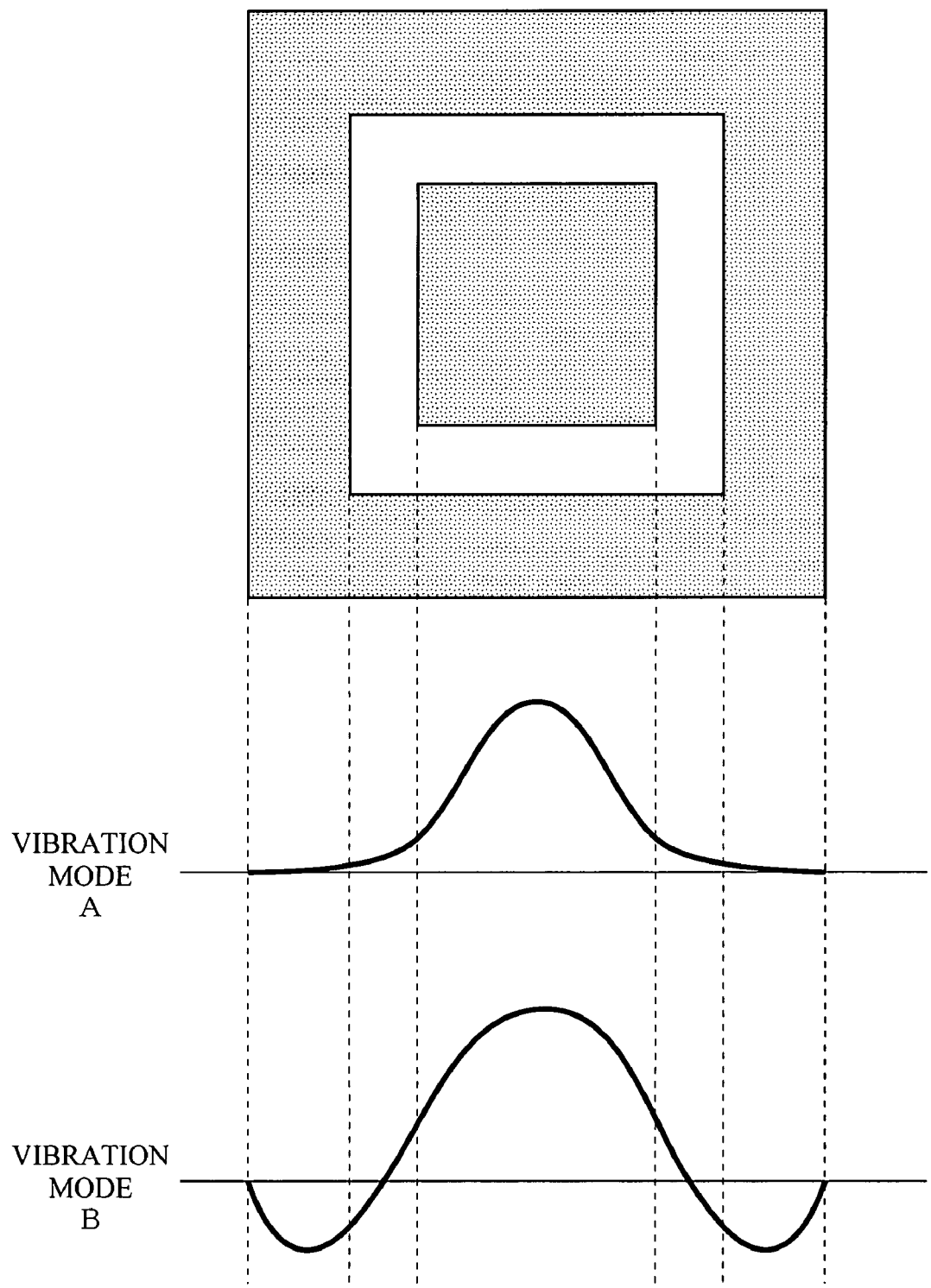
FIG. 16 is a diagram explaining two vibration modes generated by the thin film elastic wave resonator according to the third embodiment of the present invention.

In the thin film elastic wave resonator 3, having the above-described structure, according to the third embodiment, when an electrical signal is applied between the first electrode section 53 and the third electrode section 33 (or between the second electrode section 54 and the fourth electrode section 34), as shown in FIG. 16, vibration in a vibration mode A and a vibration mode B whose vibration patterns are different from each other is generated. Therefore, when the respective electrodes and the piezoelectric body are set in an appropriate manner so that an anti-resonance frequency fa(A) in the vibration mode A and a resonance frequency fr(B) in the vibration mode B substantially coincide with each other, characteristics of a filter having a wide passband can be realized (see FIG. 6).

As described above, the thin film elastic wave resonator 3 according to the third embodiment of the present invention, having a structure of a stand-alone resonator, reduces an energy loss and realizes a band-pass filter having a wide passband.

Fourth Embodiment

Figure 17:
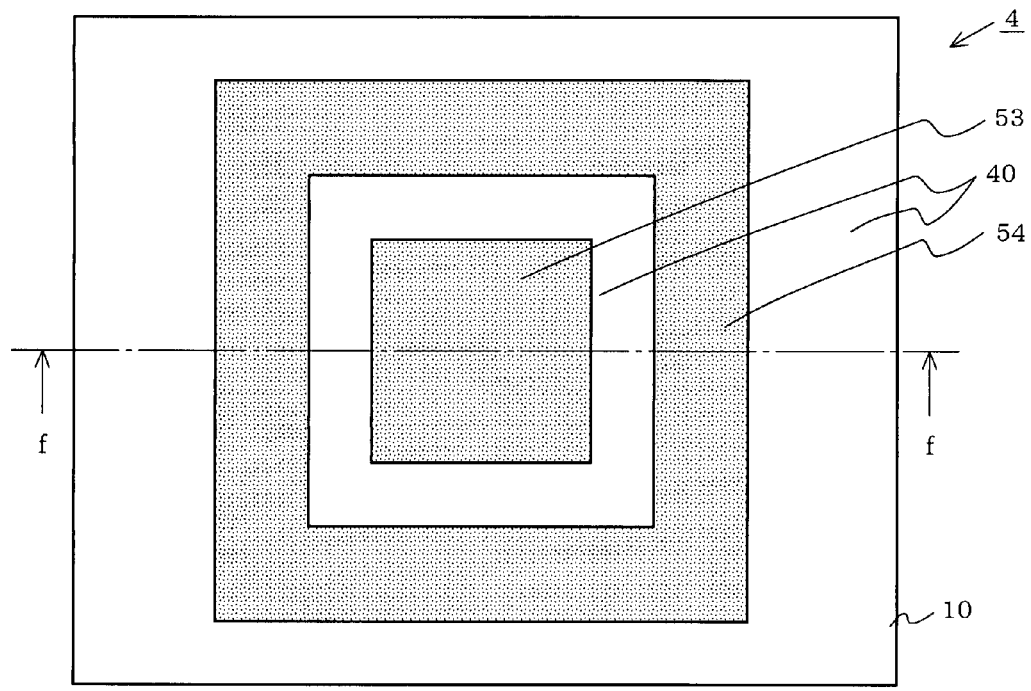
FIG. 17 is a structure diagram illustrating a top view of a thin film elastic wave resonator according to a fourth embodiment of the present invention.
Figure 18A:
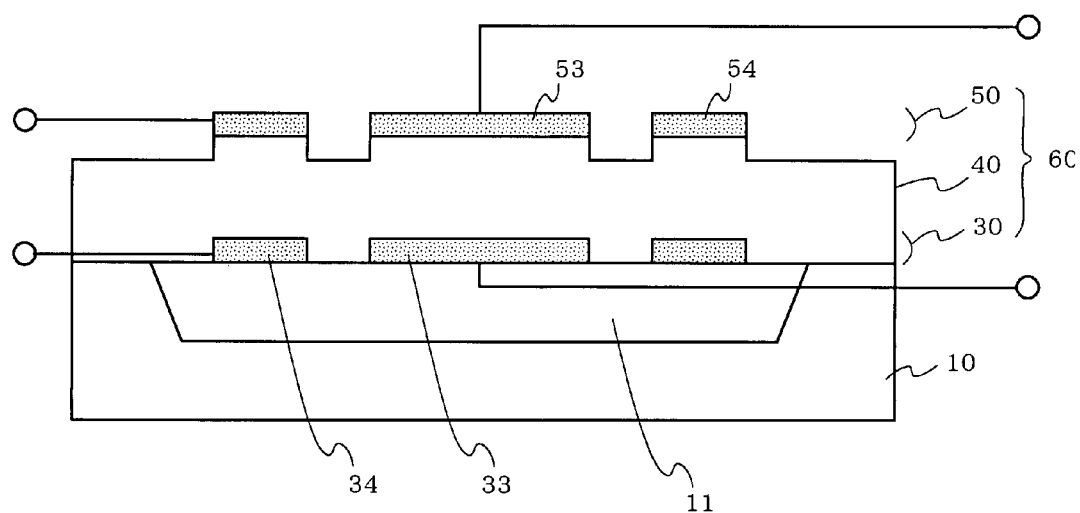
FIG. 18A is a structure diagram illustrating a cross-sectional view of the thin film elastic wave resonator according to the fourth embodiment of the present invention (a cross-sectional view along a line f-f shown in FIG. 17).

FIG. 17 is a diagram illustrating a top view of a constructional example of a thin film elastic wave resonator 4 according to a fourth embodiment of the present invention. FIG. 18A is a diagram illustrating a cross-sectional view of the thin film elastic wave resonator 4 shown in FIG. 17 along a line f-f. In FIGS. 17 and 18A, the thin film elastic wave resonator 4 according to the fourth embodiment has a structure in which a lower electrode 30, a piezoelectric body 40, and an upper electrode 50 are formed in order on a semiconductor substrate 10 having a cavity 11 formed therein. A vibration section 60 includes the lower electrode 30, the piezoelectric body 40, and the upper electrode 50. The semiconductor substrate 10 is a supporting section for the vibration section 60.

As shown in FIG. 18A, the thin film elastic wave resonator 4 according to the fourth embodiment has a structure in which the cavity 11, instead of the acoustic mirror 20 in the thin film elastic wave resonator 3 according to the above-described third embodiment, is provided in the semiconductor substrate 10. This cavity 11 is provided for containing resonant vibration of the vibration section 60 inside of the vibration section 60, similarly to the acoustic mirror 20.

Figure 18B:
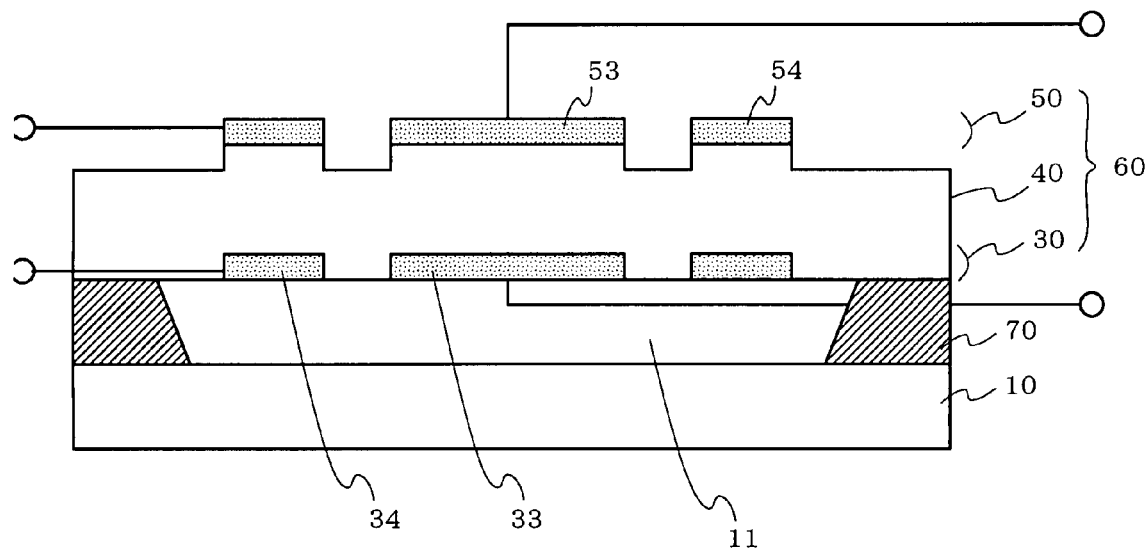
FIG. 18B is another structure diagram illustrating a cross-sectional view of the thin film elastic wave resonator according to the fourth embodiment of the present invention.

Therefore, similarly to the thin film elastic wave resonator 3 according to the third embodiment, the thin film elastic wave resonator 4 according to the fourth embodiment of the present invention, having a structure of a stand-alone resonator, reduces an energy loss and realizes a band-pass filter having a wide passband. Although in FIG. 18A, the cavity 11 formed through conducting etching or the like and caving in a part of the semiconductor substrate 10 is shown, as shown in FIG. 18B, the cavity 11 may be formed by laminating a supporting layer 70 on the semiconductor substrate 10.

Figure 19:
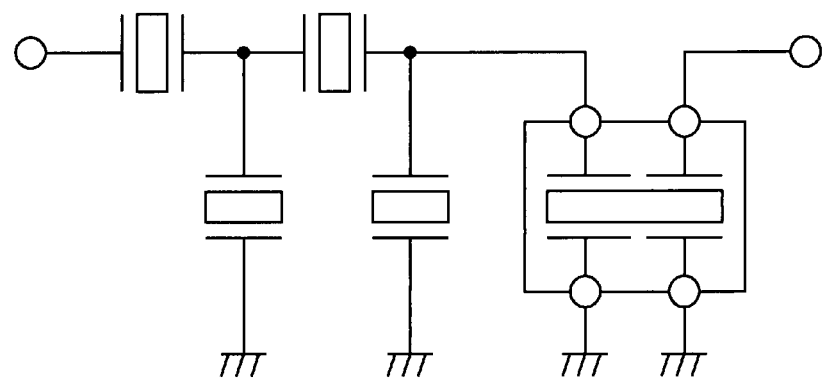
FIG. 19 is a diagram illustrating a constructional example of a ladder-type filter using the thin film elastic wave resonator of the present invention.

As described above, although each of the thin film elastic wave resonators 1 to 4 can be used as a stand-alone filter, the thin film elastic wave resonators 1 to 4 can also be used arbitrarily being combined with other thin film elastic wave resonator. For example, as shown in FIG. 19, each of the thin film elastic wave resonators 1 to 4 can be inserted at the most downstream of a ladder-type filter.

Figure 20:
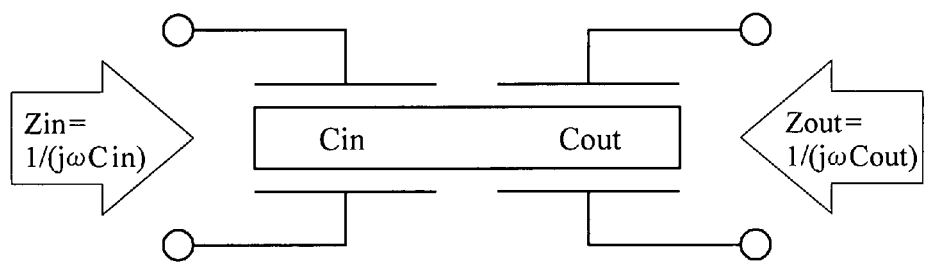
FIG. 20 is a diagram explaining impedance conversion using the thin film elastic wave resonator of the present invention.

In addition, since each of the thin film elastic wave resonators 1 to 4 of the present invention has a structure in which an inputted electrical signal is converted into vibration once and thereafter, the vibration is reconverted into an electrical signal to be taken out, it is also possible to perform impedance conversion by changing a capacitance value Cin on an input end and a capacitance value Cout on an output end (see FIG. 20). Where ϵ represents permittivity, S represents an area of an electrode, and t represents a thickness of an piezoelectric body, a capacitance value C can be obtained by using an equation C=ϵS/t.

Figure 21:
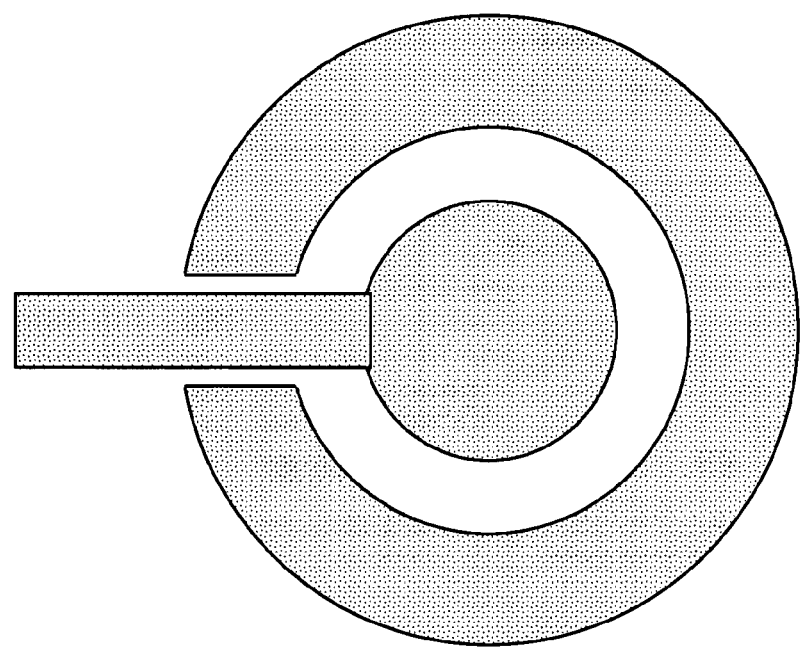
FIG. 21 is a diagram showing an example of wiring to a first electrode section and a third electrode section.
Figure 21:
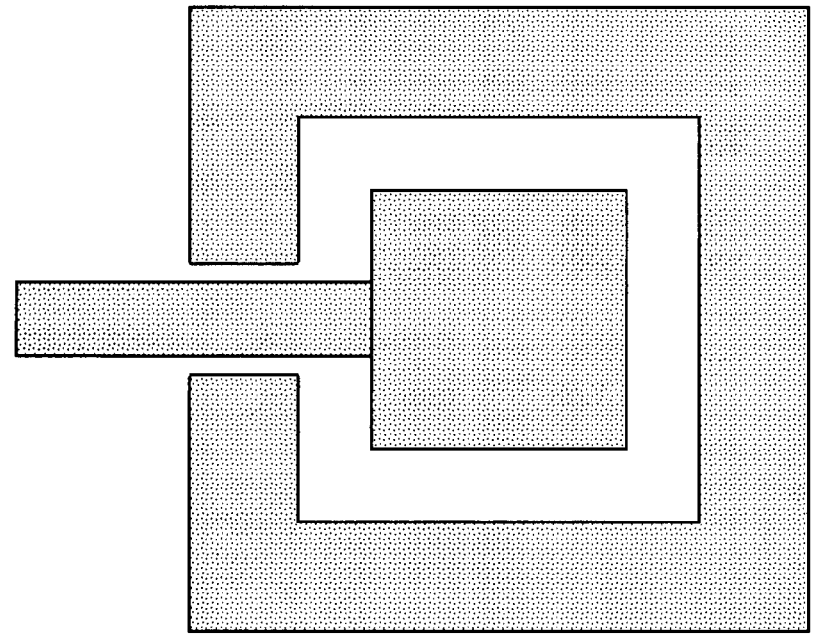

In addition, as described in the above first, second, third, and fourth embodiments, in consideration of characteristics, it is most favorable that in the thin film elastic wave resonator of the present invention, the second electrode section having a ring or frame shape is isolated from the first electrode section and the fourth electrode section having a ring or frame shape is isolated from the third electrode section, respectively. In general, however, wiring to the first electrode section and the third electrode section is made by metal wiring which is formed by etching on a semiconductor substrate. In such a case, as shown in FIG. 21, wiring is led in by cutting out a part of the second electrode section and a part of the fourth electrode section.

Figure 22:
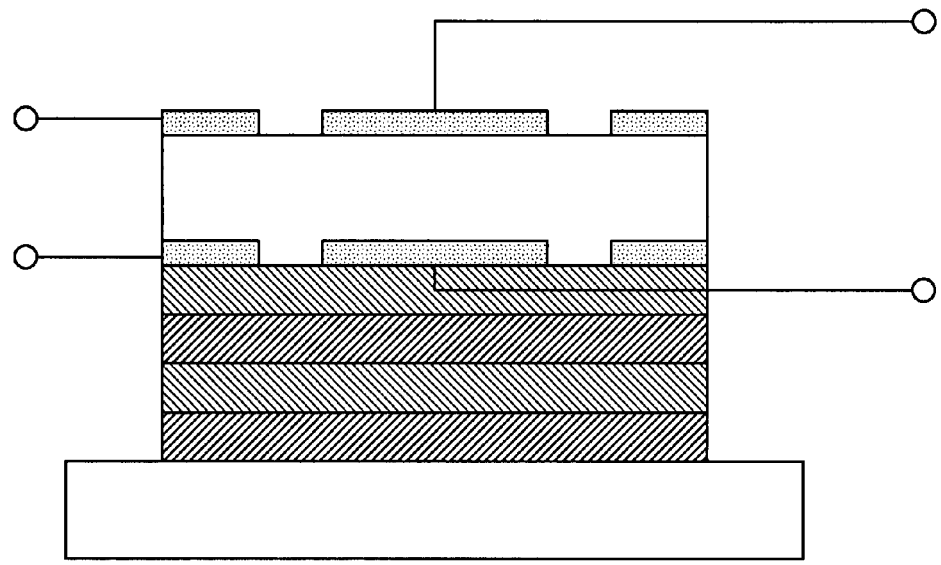
FIG. 22 is a structure diagram illustrating a cross-sectional view of the thin film elastic wave resonator in a case where the thin film elastic wave resonator of the first, second, third, or fourth embodiments of the present invention is applied.

Further, in the above-described first, second, third, and fourth embodiments, since the piezoelectric body 40 which is sandwiched by the lower electrode 30 and the upper electrode 50 is film-formed in a stand-alone manner, a thickness of the piezoelectric body is constant. As a result, an upper surface of the piezoelectric body 40 is depressed by a thickness of the lower electrode 30 between the first electrode section and the third electrode section. However, for example, by using a planarizing process such as CMP (Chemical Mechanical Polishing), as shown in FIG. 22, it is also possible to make flat the upper surface of the piezoelectric body 40. In this case, since resonance frequencies at the first electrode section, at the third electrode section, and at a portion between the first electrode section and the third electrode section approximate to one another, an advantage in use, such as facilitated excitation of desired vibration (in a vibration mode A and a vibration mode B), is great.

(Embodiment of Communication Device Using Thin Film Elastic Wave Resonator)

Figure 23:
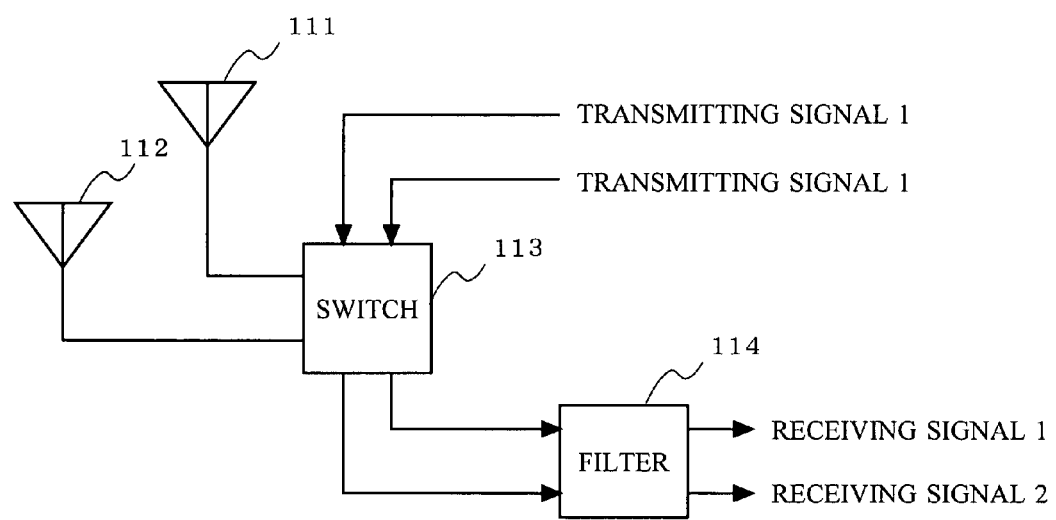
FIG. 23 is a diagram illustrating a constructional example of a communication device using the thin film elastic wave resonator of the present invention.
Figure 24:
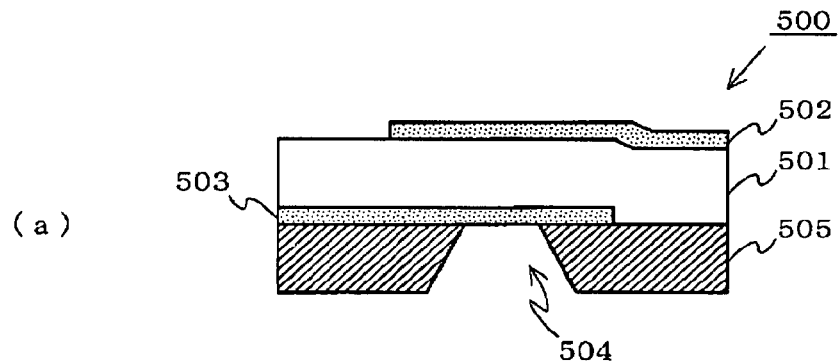
FIG. 24 is a diagram explaining a conventional thin film elastic wave resonator.
Figure 24:
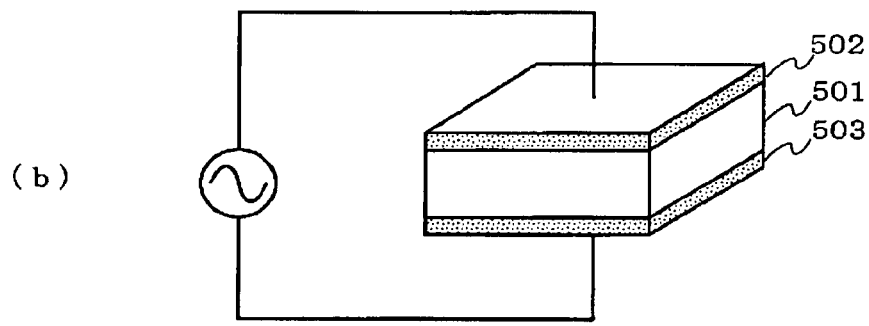
Figure 24:
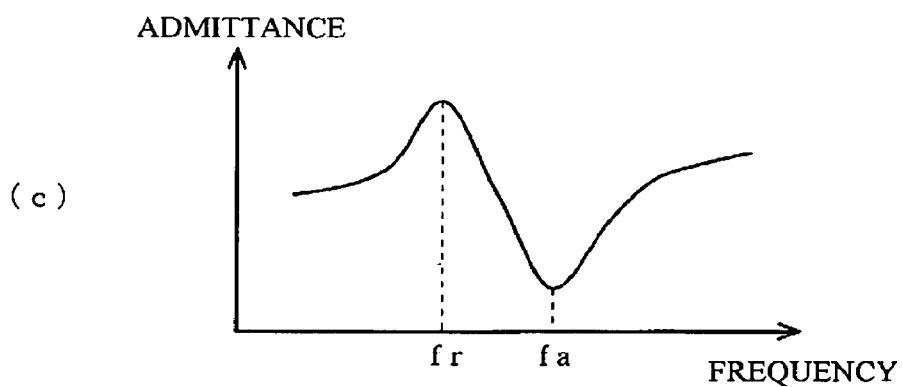
Figure 24:
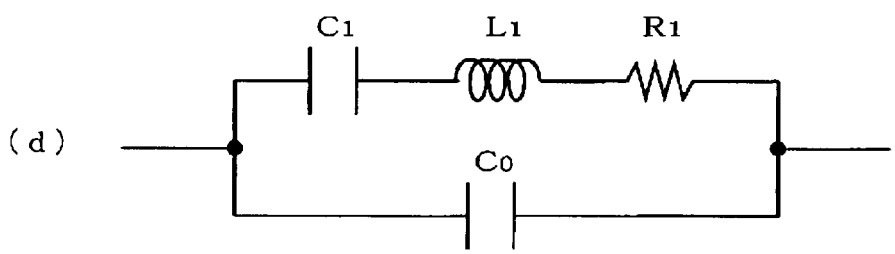
Figure 25:
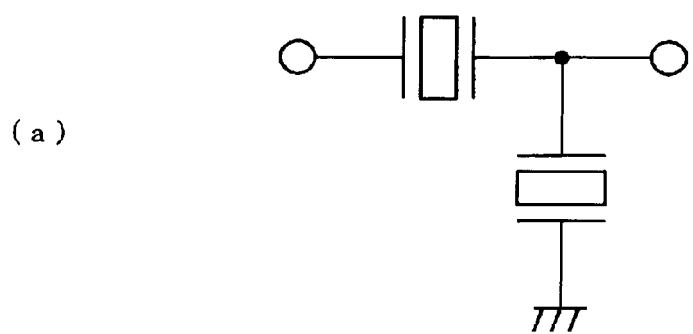
FIG. 25 is a structure diagram illustrating a filter using the conventional thin film elastic wave resonator.
Figure 25:
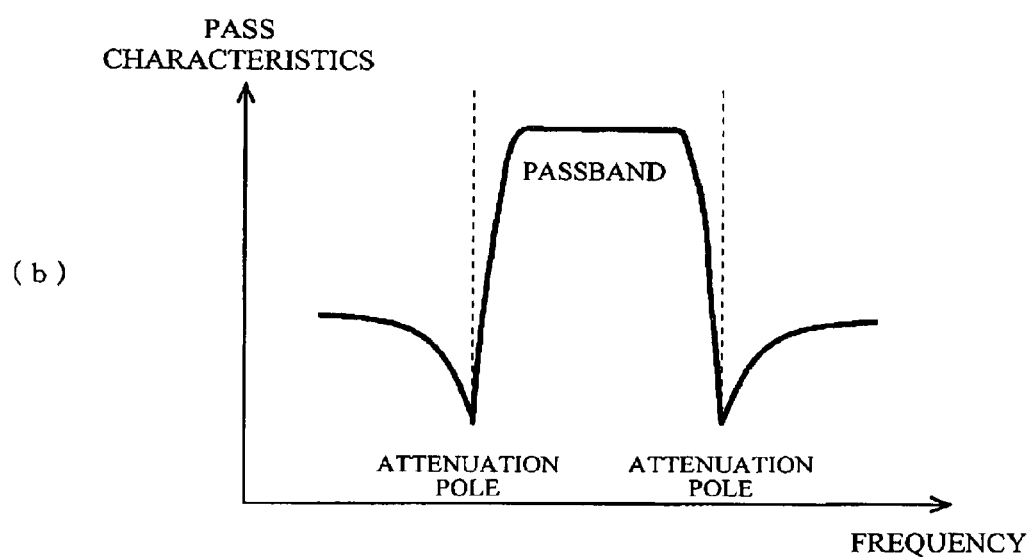

FIG. 23 is a diagram showing a constructional example of a communication device using a thin film elastic wave resonator of the present invention. In the communication device shown in FIG. 23, any of the thin film elastic wave resonators 1 to 4 described in the first, second, third, and fourth embodiments is used as a filter. This communication device comprises two antennas 111 and 112, a switch 113 for switching between two frequency signals, and a filter 114. This configuration allows a realization of a low-loss communication device The thin film elastic wave resonator of the present invention is applicable, for example, when it is desired that a band-pass filter which reduces an energy loss and has a wide pass band is realized in a stand-alone manner.

The invention claimed is:

1. A thin film elastic wave resonator which vibrates at a predetermined frequency, comprising:
    a piezoelectric body;
    a first electrode section formed on the one surface of the piezoelectric body;
    a second electrode section formed on the one surface of the piezoelectric body and positioned to encompass the first electrode section and be insulated from the first electrode section;
    a third electrode section formed on another surface of the piezoelectric body, the another surface of the piezoelectric body facing the one surface of the piezoelectric body;
    a fourth electrode section formed on the another surface of the piezoelectric body and positioned to encompass the third electrode section and be insulated from the third electrode section; and
    a supporting section, for supporting a structure formed by the piezoelectric body and the first, second, third and fourth electrode sections, which includes a substrate,
    wherein an electrical signal is inputted to the first electrode section and the third electrode section and an electrical signal is outputted from the second electrode section and the fourth electrode section, or an electrical signal is inputted to the second electrode section and the fourth electrode section and an electrical signal is outputted from the first electrode section and the third electrode section, and wherein a clearance between the first electrode section and the second electrode section is equal to or greater than a thickness of the piezoelectric body.

2. The thin film elastic wave resonator according to claim 1, wherein an area of the first electrode section is substantially equal to an area of the third electrode section and an area of the second electrode section is substantially equal to an area of the fourth electrode section.

3. The thin film elastic wave resonator according to claim 2, wherein the first and third electrode sections are circular and the second and fourth electrode sections are annular.

4. The thin film elastic wave resonator according to claim 2, wherein the first and third electrode sections are polygonal and the second and fourth electrode sections are multi-sided frame shaped.

5. The thin film elastic wave resonator according to claim 2, wherein a center of the first electrode section and a center of the second electrode section coincide, and a center of the third electrode section and a center of the fourth electrode section coincide.

6. The thin film elastic wave resonator according to claim 1, wherein the first and third electrode sections are circular and the second and fourth electrode sections are annular.

7. The thin film elastic wave resonator according to claim 1, wherein the first and third electrode sections are polygonal and the second and fourth electrode sections are multi-sided frame shaped.

8. The thin film elastic wave resonator according to claim 1, wherein a center of the first electrode section and a center of the second electrode section coincide, and a center of the third electrode section and a center of the fourth electrode section coincide.

9. The thin film elastic wave resonator according to claim 1, wherein the supporting section is structured by the substrate having a cavity provided therein and the third and fourth electrode sections are disposed on the cavity.

10. The thin film elastic wave resonator according to claim 1, wherein the supporting section is structured by the substrate and a supporting layer laminated for forming a cavity on the substrate and the third and fourth electrode sections are disposed on the cavity.

11. The thin film elastic wave resonator according to claim 1, wherein the supporting section is structured by the substrate and an acoustic mirror formed by alternately laminating a layer in which an impedance is acoustically high and a layer in which an impedance is acoustically low, and the third and fourth electrode sections are disposed on the acoustic mirror.

12. A filter being structured by a plurality of thin film elastic wave resonators, wherein at least one of the plurality of thin film elastic wave resonators is the thin film elastic wave resonator according to claim 1.

13. A communication device including the filter according to claim 12.

14. A thin film elastic wave resonator which vibrates at a predetermined frequency, comprising:
a piezoelectric body;
a first electrode section formed on one surface of the piezoelectric body;
a second electrode section formed on the one surface of the piezoelectric body and positioned to encompass the first electrode section and be insulated from the first electrode section;
a third electrode section formed on another surface of the piezoelectric body, the another surface of the piezoelectric body facing the one surface of the piezoelectric body; and
a supporting section, for supporting a structure formed by the piezoelectric body and the first, second and third electrode sections, which includes a substrate,
wherein an electrical signal is inputted to the first electrode section and the third electrode section and an electrical signal is outputted from the second electrode section and the third electrode section, or an electrical signal is inputted to the second electrode section and the third electrode section and an electrical signal is outputted from the first electrode section and the third electrode section, and
wherein a clearance between the first electrode section and the second electrode section is equal to or greater than a thickness of the piezoelectric body.

15. The thin film elastic wave resonator according to claim 14, wherein the first electrode section is circular and the second electrode section is annular.

16. The thin film elastic wave resonator according to claim 14, wherein the first electrode section is polygonal and the second electrode section is multi-sided frame shaped.

17. The thin film elastic wave resonator according to claim 14, wherein a center of the first electrode section and a center of the second electrode section coincide.

18. The thin film elastic wave resonator according to claim 14, wherein the supporting section is structured by the substrate having a cavity provided therein and the third electrode section is disposed on the cavity.

19. The thin film elastic wave resonator according to claim 14, wherein the supporting section is structured by the substrate and an acoustic mirror formed by alternately laminating a layer in which an impedance is acoustically high and a layer in which an impedance is acoustically low and the third electrode section is disposed on the acoustic mirror.

20. A filter being structured by a plurality of thin film elastic wave resonators, wherein at least one of the plurality of thin film elastic wave resonators is the thin film elastic wave resonator according to claim 14.

* * * * *